US007488374B2

(12) United States Patent
Komatsu (10) Patent No.: US 7,488,374 B2
(45) Date of Patent: Feb. 10, 2009

(54) TRAPPING DEVICE, PROCESSING SYSTEM, AND METHOD REMOVING IMPURITIES

(75) Inventor: Tomohito Komatsu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 544 days.

(21) Appl. No.: 10/562,127

(22) PCT Filed: Jun. 22, 2004

(86) PCT No.: PCT/JP2004/008759

§ 371 (c)(1),
(2), (4) Date: Dec. 23, 2005

(87) PCT Pub. No.: WO2005/000440

PCT Pub. Date: Jan. 6, 2005

(65) Prior Publication Data

US 2006/0144234 A1    Jul. 6, 2006

(30) Foreign Application Priority Data

Jun. 25, 2003  (JP) .............................. 2003-181846

(51) Int. Cl.
*B01D 53/00* (2006.01)
(52) U.S. Cl. .................. 95/288; 55/467.1; 55/DIG. 15; 62/55.5
(58) Field of Classification Search .................. 95/288; 55/385.2, 467.1, DIG. 15; 62/55.5
See application file for complete search history.

(56) References Cited

U.S. PATENT DOCUMENTS 6,238,514 B1 *  5/2001  Gu ........................ 156/345.29

FOREIGN PATENT DOCUMENTS

| JP | 62-004405   | 1/1987 |
|----|-------------|--------|
| JP | 6-190227    | 7/1994 |
| JP | 7-169663    | 7/1995 |
| JP | 2001-214272 | 8/2001 |
| JP | 2002-503042 | 1/2002 |

* cited by examiner

*Primary Examiner*—Robert A Hopkins
(74) *Attorney, Agent, or Firm*—Oblon, Spivak, McClelland, Maier & Neustadt, P.C.

(57) ABSTRACT

A trapping device is disclosed which is arranged in a vacuum exhaust system (6) for removing gaseous impurities contained in the exhaust gas flowing through the vacuum exhaust system (6) which has a vacuum pump (36) for vacuum exhausting a processing unit (10) wherein a certain process is conducted on a semiconductor wafer. The trapping device comprises an impurity collecting chamber (50) arranged along the exhaust passage in the vacuum exhaust system (6) and a nozzle means (64) which injects a working fluid that is in a supersonic state due to adiabatic expansion for mixing the fluid with the exhaust gas and lowering the temperature of the exhaust gas to or below the critical points of the impurities within the impurity collecting chamber (50).

17 Claims, 6 Drawing Sheets

TRAPPING DEVICE, PROCESSING SYSTEM, AND METHOD REMOVING IMPURITIES

FIELD OF THE INVENTION

The present invention relates to a trap apparatus, a processing system, and an impurity removal method for removing gaseous impurities from an exhaust gas discharged from a processing apparatus such as a film forming apparatus or the like.

BACKGROUND OF THE INVENTION

Generally, for forming an integrated circuit such as an IC or a logic device, there are repeatedly performed a process for forming a desired thin film on a surface of a semiconductor wafer, a glass substrate, an LCD substrate or the like; and a process for etching it in a desired pattern.

For example, in a film forming process, a specified processing gas (source gas) reacts in a processing vessel to form a silicon thin film, a thin film of a silicon oxide or nitride, or a metal thin film, a thin film of a metal oxide or metal nitride, or the like. As a result of the film forming process, residual reaction by-products are produced to be discharged with an exhaust gas. In addition, an unreacted processing gas is discharged.

If the reaction by-products or the unreacted processing gas are discharged into the air as they are, they may cause environmental pollution and the like. For preventing this, conventionally, a trap apparatus has been installed in an exhaust gas system extending from a processing vessel. In this way, the reaction by-products, the unreacted processing gas and the like, which are contained in the exhaust gas, have been collected and removed.

Various configurations of the trap apparatus have been proposed based on characteristics of the reaction by-products and the like that must be collected and removed. For example, in case of removing reaction by-products, which are condensed (liquefied) and/or coagulated (solidified) at room temperature, the trap apparatus can be configured such that multiple fins are provided in a housing having an inlet opening and an outlet opening of the exhaust gas. The fins are sequentially arranged along a flow direction of the exhaust gas, and the reaction by-products in the exhaust gas are collected by surfaces of the fins by being attached thereon when the exhaust gas passes between the fins. Further, the fins have been cooled by a cooling fluid to increase collection efficiency.

Here, as an example, a case where a Ti metal film is formed by using as a source gas a refractory metal halogen compound, i.e., $TiCl_4$ (titanium tetrachloride), will now be explained. $H_2$ gas as well as $TiCl_4$ is used as the source gas, and these gases are activated by a plasma in the presence of Ar gas to thereby be reduced by hydrogen. As a result, the Ti film is deposited on a surface of the semiconductor wafer. During the process, $TiCl_X$ (X<4) is produced as a reaction by-product and there also exists an unreacted $TiCl_4$ gas, which are discharged as the exhaust gas. Since these $TiCl_X$ and $TiCl_4$ are impurity gases causing air pollution and the like, they are trapped by such a trap apparatus.

Here, the impurity gases such as the above-described $TiCl_4$ as the unreacted gas, $TiCl_X$ as the reaction by-product and the like, have relatively high vapor pressures, so that it is very difficult to completely trap and remove them in the trap apparatus, even when the trap apparatus is cooled as mentioned above. Thus, satisfactory recovery rate could not be realized.

For completely removing the impurity gases passing through the trap apparatus and making them harmless, there has been provided a waste gas scrubber at a downstream side of the trap apparatus, which gives rise to soaring running cost of the waste gas scrubber and shortening of life span thereof. Such problems are common to the film forming apparatus, which employs a refractory metal compound gas such as $TiCl_4$, $WF_6$, $(Ta(OE)_5)_2$ or the like.

As for another film forming method using $TiCl_4$, there has been known a method for forming a TiN film. Namely, as an example, a case where a TiN film is formed by using as a source gas a refractory metal halogen compound, i.e., $TiCl_4$ (titanium tetrachloride), will now be explained. $NH_3$ gas as well as $TiCl_4$ is used as the source gas, and both gases react with each other to deposit the TiN film on a surface of the semiconductor wafer. At this time, $NH_4Cl$ or $TiCl_4(NH_3)_n$ (n is a positive integer) is produced as the reaction by-product, and an unreacted $TiCl_4$ gas is also present. These gas components are discharged as the exhaust gas to be trapped by the aforementioned trap apparatus.

Further, in order to more completely remove the impurity gas, e.g., a chloride gas, contained in the exhaust gas, there has been proposed a method for efficiently removing the impurity gas by mixing the exhaust gas in a gas exhaust system with a reactive gas, e.g., an ammonium gas, which reacts with the impurity gas, to convert the impurity gas into, e.g., an ammonium chloride, which is likely to be condensed; and by cooling and condensing the ammonium chloride in the trap apparatus to be trapped therein (Japanese Patent Laid-open Application No. 2001-214272).

Still further, in Japanese Patent Laid-open Application No. S62-4405, there has been disclosed a technology wherein circular trap plates having small holes are placed in multi-levels inside a wax trap apparatus such that an exhaust gas passing through the small holes is cooled by a self-cooling while being adiabatically expanded, to thereby liquefy a wax to be collected, when liquefying the wax in the exhaust gas containing a wax vapor discharged from a sintering furnace for sintering a powder molding product and collecting it therefrom.

However, in the conventional trap apparatus as described in the aforementioned Japanese Patent Laid-open Application No. 2001-214242, if captured materials are attached to the cooling fins as the trap process progresses, cooling efficiency of the exhaust gas gets declined since the exhaust gas exchanges heat with the cooling fins through a captured material layer. For the same reason, collection efficiency becomes lowered due to aging, so that the impurity gases could not be completely removed and the increasing in the frequency of maintenance and repair becomes problematic. For preventing deterioration of collection efficiency due to aging, it may be considered that the cooling fins are set in multi-levels. However, it is impractical since the apparatus becomes significantly enlarged in this case. Moreover, in case of removing the captured materials from the cooling fins by a cleaning operation during the maintenance and repair, it becomes difficult to perform the cleaning operation since the cooling fins are formed in multi-levels, and thus a whole structure is complicated.

Further, in the trap apparatus as described in Japanese Patent Laid-open Application No. S62-4405, in case where the captured materials are of a semisolid mass having a viscosity, the small holes of the circular trap plate are getting clogged with the captured materials, so that the increasing in the frequency of maintenance and repair becomes problematic.

Still further, in the trap apparatus as described in Japanese Patent Laid-open Application No. S62-4405, cooling efficiency is not very high since the exhaust gas is adiabatically expanded through the small holes. Thus, the impurity gas in the exhaust gas is not fully collected, thereby lowering collection efficiency.

SUMMARY OF THE INVENTION

The present invention is contrived on the basis of the aforementioned problems and is to solve them effectively. It is, therefore, an object of the present invention to provide a trap apparatus, a processing system and an impurity removal method for removing gaseous impurities from an exhaust gas, wherein a simple structure is employed and collection efficiency can be kept high all the time.

As a result of a study on a method for trapping gaseous impurities in the exhaust gas, the inventors have developed the present invention by obtaining a knowledge that the exhaust gas is efficiently cooled by introducing thereinto an operation fluid, which is in a supersonic state by adiabatic expansion through a Laval nozzle, and thus the gaseous impurities are condensed and/or coagulated to thereby be collected.

The present invention provides, a trap apparatus, installed in a vacuum exhaust system having a vacuum pump for vacuum exhausting a processing apparatus for performing a process on an object, for removing a gaseous impurity contained in an exhaust gas flowing through the vacuum exhaust system, the trap apparatus including: an impurity collecting vessel installed in an exhaust passageway of the vacuum exhaust system; and a nozzle unit for injecting an operation fluid to mix therewith the exhaust gas, and lowering an exhaust gas temperature down to or below a critical temperature of the impurity in the impurity collecting vessel, wherein the operation fluid is in a supersonic state by adiabatic expansion.

As described above, by injecting the operation fluid adiabatically expanded by the nozzle unit to thereby be in the supersonic state, the exhaust gas is cooled to condense and/or coagulate the gaseous impurity, to thereby trap them. Therefore, cooling efficiency can be kept high all the time, and thus collection efficiency can be kept high all the time. Further, when performing a maintenance and repair operation for removing, e.g., viscous captured materials, which have been condensed and/or coagulated to thereby be attached to impurity collecting vessel, the maintenance and repair operation can be carried out rapidly and easily since complicated structures such as the cooling fins and the like used for the conventional trap apparatus are not necessary.

In this case, the trap apparatus further includes one or more nozzle units provided in parallel with each other with respect to the impurity collecting vessel.

Further, the nozzle unit contains a nozzle main body configured to have a flow path whose cross section becomes narrower along a flow direction of the operation fluid, and then, becomes wider after passing a larynx portion.

Still further, the nozzle main body has an operation fluid injection opening having a substantially circular cross section; and a ring shaped exhaust gas inlet opening is formed to surround a periphery of the operation fluid injection opening to thereby introduce the exhaust gas towards the impurity collecting vessel.

Still further, the nozzle main body has an operation fluid injection opening having a substantially ring shaped cross section; and, in a central portion thereof, there is formed a substantially circular exhaust gas inlet opening for introducing the exhaust gas towards the impurity collecting vessel.

Still further, there is provided a front end reservoir chamber for temporarily reserving the exhaust gas flowing towards the exhaust gas inlet opening.

Still further, at a tip end side of the nozzle unit, there are provided a mixing tube for mixing the operation fluid in the supersonic state injected from the operation fluid injection opening and the exhaust gas introduced from the exhaust gas inlet opening; and a diffusion tube whose flow path cross section becomes gradually broader to have a pumping function, wherein the mixing tube and the diffusion tube are connected in sequence.

Still further, the mixing tube and the diffusion tube are provided with an adhesion prevention heater unit for preventing the impurity from being attached thereto by being condensed and/or coagulated.

In this manner, it is possible to prevent the impurities as, e.g., viscous semisolid materials, from being attached to the inner wall surfaces, since the mixing tube and the diffusion tube are heated by the adhesion prevention heater unit.

Still further, there is installed a nuclei introduction unit for introducing a substance to be used as nuclei when the gaseous impurity is condensed and/or coagulated.

In this manner, the gaseous impurities are prevented from being in the supercooled state to thereby facilitate the condensation and/or coagulation by introducing nuclei to be origins (seeds) of transition to the condensation and/or coagulation into the exhaust gas, so that collection efficiency of the impurities can be further improved.

Still further, in the impurity collecting vessel, there is attachably and detachably installed an impurity adhesion plate for adhering thereon a condensed and/or coagulated impurities.

Still further, the nozzle unit is a Laval nozzle.

Still further, the operation fluid is formed of $N_2$, $H_2$, Ar or He gas.

Still further, the processing apparatus is a film forming apparatus for performing a film formation on the object.

Still further, the present invention provides a processing system, including: a processing apparatus for performing a process on an object; a vacuum exhaust system having a vacuum pump for vacuum exhausting the processing apparatus; and the trap apparatus of any one of claims 1 to 13 installed in the vacuum exhaust system.

Still further, the present invention defines, a trap method performed by using the above-described trap apparatus, and provides an impurity removal method for removing a gaseous impurity from an exhaust gas discharged from a processing apparatus which performs a process on an object, the method including the step of: condensing and/or coagulating the impurity by mixing an operation fluid and the exhaust gas injecting the operation fluid into the exhaust gas, the operation fluid being in a supersonic state by adiabatic expansion; and lowering an exhaust gas temperature down to or below a critical point of the impurity.

In this case, the exhaust gas is injected to surround a periphery of the operation fluid when the exhaust gas and the operation fluid are mixed.

Further, the operation fluid is injected to surround a periphery of the exhaust gas when the exhaust gas and the operation fluid are mixed.

DETAILED DESCRIPTION OF THE PREFERRED EMBODIMENT

Preferred embodiments of a trap apparatus, a processing system and an impurity removal method in accordance with the present invention will be described below with reference to the accompanying drawings.

First Embodiment

Figure 1:
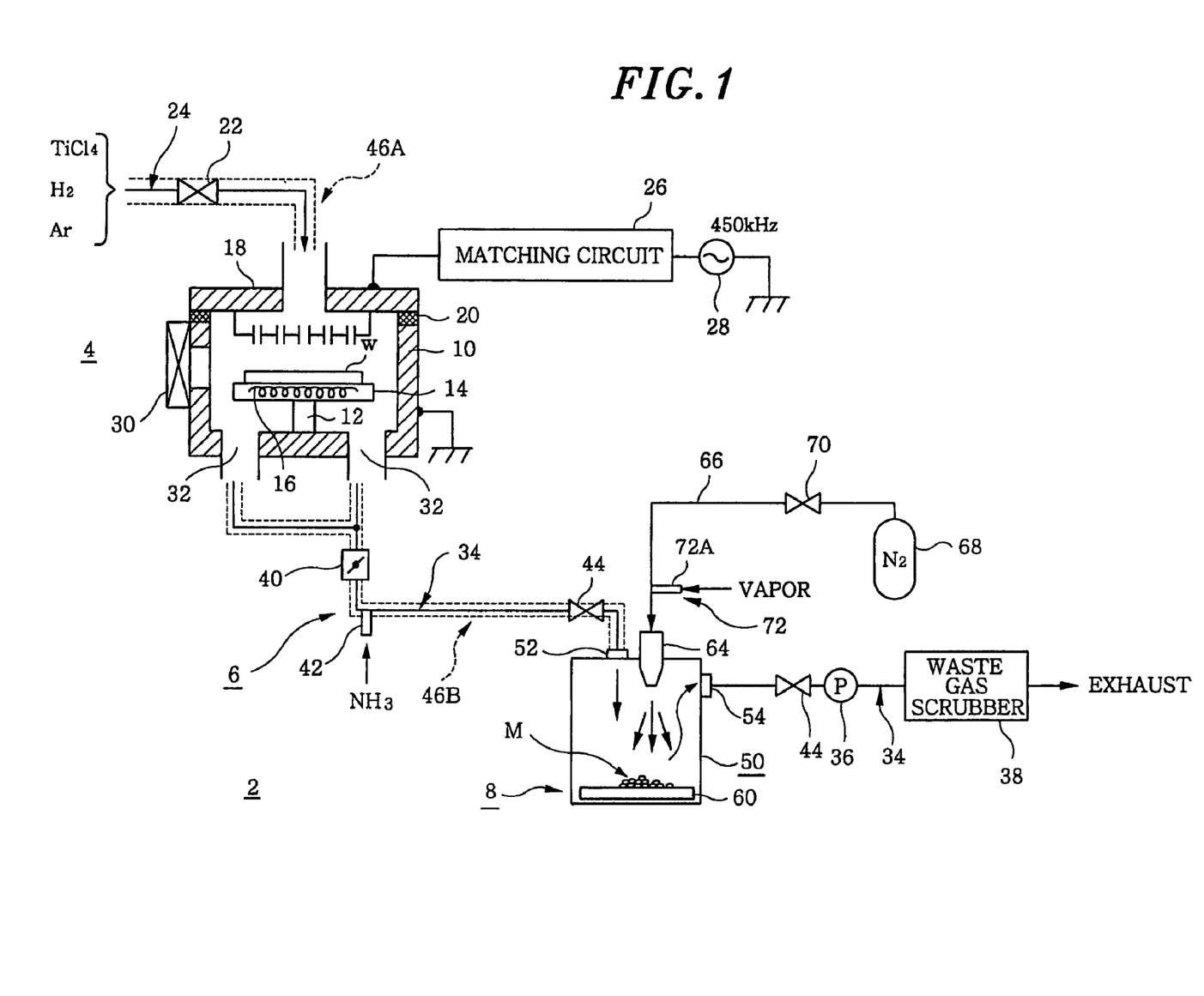
FIG. 1 offers a schematic diagram of an exemplary processing system in which a trap apparatus in accordance with the present invention is provided.
Figure 2:
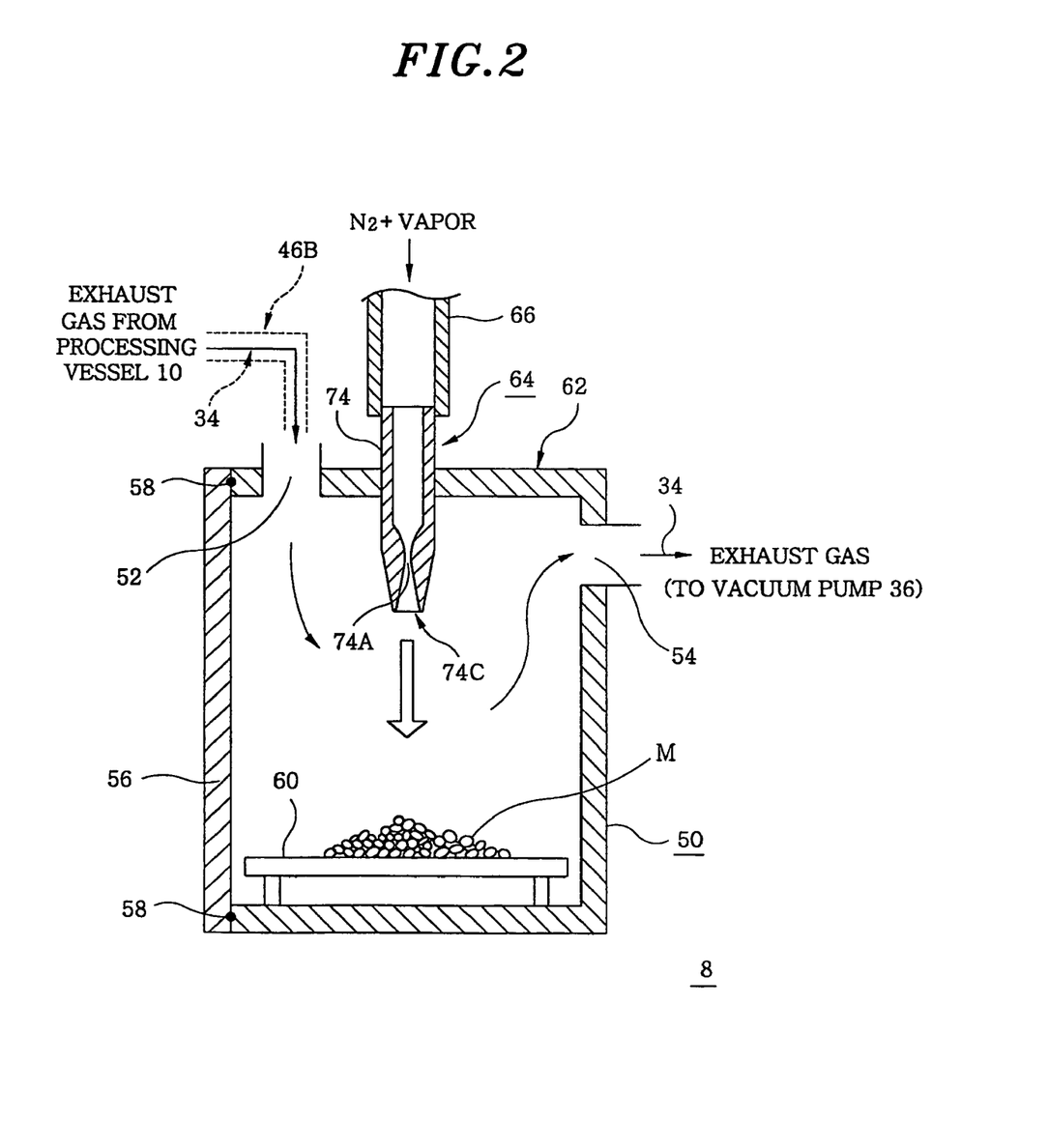
FIG. 2 is a cross sectional view showing a first embodiment of a trap apparatus in accordance with the present invention.

FIG. 1 is a schematic diagram of an exemplary processing system in which a trap apparatus in accordance with the present invention is provided; and FIG. 2 is a cross sectional view showing a first embodiment of a trap apparatus in accordance with the present invention.

In the present embodiment, as an example, there will now be explained a case where a Ti film is formed on a surface of a semiconductor wafer, i.e., a substrate to be processed, by a plasma CVD (chemical vapor deposition) using as a source gas a refractory metal halogen compound, i.e., $TiCl_4$ gas.

As shown in FIG. 1, a processing system 2 includes a processing apparatus (film forming apparatus) 4 for performing a film formation of a Ti film on a semiconductor wafer W; a vacuum exhaust unit 6 for exhausting an inside of the processing apparatus 4 to vacuum; and a trap apparatus 8 of the present invention, which is installed in the vacuum exhaust system 6.

First, the processing apparatus 4 will now be discussed. The processing apparatus 4 has, e.g., a barrel shaped processing vessel 10 made of aluminum, wherein the processing vessel 10 is grounded. In the processing vessel 10, a mounting table 14 is provided through a conductive support 12 from a bottom portion, which mounts thereon the semiconductor wafer W as an object to be processed. The mounting table 14 is made of a conductive material, e.g., Ni or the like, and serves as a lower electrode having therein a resistance heater 16 for heating the semiconductor wafer W.

Further, in a ceiling portion of the processing vessel 10, there is provided a shower head 18 for introducing required gases, such as a source gas and the like, into the processing vessel 10 through an insulating member 20; and a gas supply line 24 having therein a supply side opening/closing valve 22 is connected to the shower head 18 to supply therethrough the required gases, such as $TiCl_4$ gas, $H_2$ gas, Ar gas and the like at respectively controlled flow rates. Alternatively, the gases may be supplied through independent supply lines, respectively.

Still further, the shower head 18 serves as an upper electrode, and a high frequency power supply 28 of, e.g., 450 kHz, is connected thereto via a matching circuit 26 to produce a plasma by a high frequency between the mounting table 14 and the shower head 18. Here, the frequency of the high frequency power supply 28 is not limited to 450 kHz, but other frequencies, e.g., 13.56 MHz and the like, may be employed.

Still further, on a sidewall of the processing vessel 10, there is provided a gate valve 30 for loading/unloading the wafer W; and in a periphery portion of a bottom portion, there is provided a gas exhaust port 32.

Meanwhile, the vacuum exhaust system 6 contains a stainless steel exhaust passageway 34 having an inner diameter of, e.g., about 10 cm, which is connected to the gas exhaust port 32. In this exhaust passageway 34, there are installed the trap apparatus 8 for removing gaseous impurities from the exhaust gas; a vacuum pump 36 for vacuum pumping an atmosphere of the processing vessel 10; and a waste gas scrubber 38 for completely removing the impurity gases remaining in the exhaust gas, in this order towards the downstream side thereof.

Further, in an uppermost stream side of the exhaust passageway 34, there is installed a pressure control valve 40 for controlling an inner pressure of the processing vessel 10 by changing a flow path cross section of the exhaust passageway 34. At immediate downstream of the pressure control valve 40 in the exhaust passageway 34, there is provided an ammonia gas nozzle 42 for injecting into the exhaust passageway 34 an ammonia ($NH_3$) gas at a controlled flow rate. The ammonia gas is injected into the exhaust gas flowing therethrough, and reacts with a hydrogen chloride or a chorine gas contained in the exhaust gas to form an ammonium chloride and the like.

Still further, in an immediate upstream side and an immediate downstream side of the trap apparatus 8 in the exhaust passageway 34, there are installed opening/closing valves 44 for separating the trap apparatus 8 from the exhaust passageway 34 when it is attached/detached. Moreover, the gas supply line 24 and the exhaust passageway 34 between the processing vessel 10 and the trap apparatus 8 are wrapped with tape heaters 46A and 46B, respectively, as indicated by dotted lines in the drawing. Thus, the impurity gases flowing through the respective passageways 24 and 34 are heated to temperatures higher than critical temperatures thereof (condensation temperatures or coagulation temperatures) to prevent the impurity gases from being liquefied or solidified inside the passageways 24 and 34.

Still further, as shown in FIG. 2, the trap apparatus 8 in accordance with the present invention includes a box shaped impurity collecting vessel 50 made of aluminum. In a ceiling portion of the impurity collecting vessel 50, there is formed a gas inlet 52, connected to the exhaust passageway 34 extending from an upstream side, for introducing the exhaust gas therethrough. Moreover, at one sidewall of the impurity collecting vessel 50, there is formed a gas outlet 54, connected to the exhaust passageway 34 extending towards the downstream side thereof, for discharging gases towards the downstream side. Therefore, the exhaust gas from which the gaseous impurities have been removed is discharged towards the downstream. Here, the installation positions of the gas inlet 52 and the gas outlet 54 are not specifically limited thereto.

Still further, another sidewall of the impurity collecting vessel 50 serves as, e.g., an opening/closing door 56 configured to be opened and closed, which is opened or closed when the maintenance, repair and the like need to be performed. The opening/closing door 56 is airtightly sealed through a sealing member 58 such as an O-ring or the like. Moreover, on a substantially entire surface of the bottom portion inside the impurity collecting vessel 50, there is equipped an impurity adhesion plate 60 configured to be attached thereto or detached therefrom, such that liquid phase impurities, which are condensed and/or coagulated to have, e.g., high viscosity, or condensed and/or coagulated impurities M (see FIG. 2), are to be deposited on a top surface thereof.

Still further, a nozzle unit 64, being a characteristic feature of the present invention, is provided in the ceiling portion of the impurity collecting vessel 50 facing the impurity adhesion plate 60. An operation gas source 68 storing, e.g., $N_2$ gas, as an operation fluid, is connected to the nozzle unit 64 through an operation gas line 66, such that the $N_2$ gas having a specified pressure is supplied to the nozzle unit 64. Moreover, in the operation gas line 66, there is installed an opening/closing valve 70 controlling the $N_2$ gas supply. In an upstream side right above the nozzle unit 64 in the operation gas line 66, there is installed a nuclei introduction unit 72 for introducing a substance to be nuclei in the operation fluid when the gaseous impurities are condensed and/or coagulated.

As for the nuclei introduction unit 72 for introducing nuclei to be origins (seeds) of transition to the condensation and/or coagulation, there is provided a gas nozzle 72A, equipped in the operation gas line 66, for introducing as nuclei a vapor at a controlled flow rate. By such a configuration, the operation fluid ($N_2$ gas) is injected in a supersonic state from the nozzle unit 64. As a result, the operation fluid, which is in the supersonic state by the adiabatic expansion, is blown into the impurity collecting vessel 50 to cool the exhaust gas by being mixed therewith, and thus the gaseous impurities are cooled below the critical temperatures to be condensed and/or coagulated.

In this case, the nozzle main body 74 forming the nozzle unit 64 as shown in FIG. 2 is configured such that a flow path cross area becomes gradually narrower along a flow direction of the operation fluid at a center side thereof; and becomes gradually broader after passing a larynx portion 74A wherein the flow path cross section is the narrowest. Thus, a lowest end portion serves as an operation fluid injection opening 74C having a substantially circular cross section. As for the nozzle unit 64, a Laval nozzle may be used, for example.

In the following, an impurity removal method to be performed by using the processing system as configured above will be explained.

First, when performing a film formation of a Ti film, a semiconductor wafer W is mounted on the mounting table 14 inside the processing vessel 10 of the processing apparatus 4 and heated to a predetermined temperature. At the same time, a high frequency power is applied between the mounting table 14 as a lower electrode and the shower head 18 as an upper electrode; specified gases, such as $TiCl_4$ gas, $H_2$ gas, Ar gas and the like, are supplied from the shower head 14 while flow rates thereof are controlled; and thus a plasma is generated in a processing space to perform a film formation of a Ti film. Simultaneously, the vacuum exhaust system 6 is operated to vacuum exhaust the atmosphere of the processing vessel 10 to thereby maintain the inside thereof at a predetermined pressure.

At this time, given that a size of a wafer is 8 inch, process conditions may be set such that a process pressure is 665 Pa ($\approx$5 Torr); a process temperature is about 650° C.; a flow rate of $TiCl_4$ gas is about 5 sccm; a flow rate of $H_2$ gas is about 2000 sccm; and a flow rate of Ar gas is about 500 sccm.

By the film forming reaction of the Ti film, $TiCl_4$ gas is consumed about 10%. However, the remaining 90% thereof is discharged with the exhaust gas as an unreacted gas or reaction by-products such as $TiCl_2$, $TiCl_3$, HCl and the like, from the gas exhaust port 32 to and through the exhaust passageway 34 of the vacuum exhaust system 6, and flows through the trap apparatus 8, the vacuum pump 36, and the waste gas scrubber 38 in that order. Here, specifically, $TiCl_4$ gas in the unreacted gas or the reaction by-products is hardly trapped since it has a relatively high vapor pressure. However, since $NH_3$ gas is introduced as a reactive gas from the ammonia gas nozzle 42 into the exhaust passageway 34, it reacts with $TiCl_4$ gas mainly to thereby form a compound formed of a $TiCl_{40} \cdot 2NH_3$ complex. A vapor pressure of this complex is much lower than that of $TiCl_4$ gas. For example, $TiCl_4$ gas has a vapor pressure of 1300 Pa at 21.3° C., and the complex has a vapor pressure of $1 \times 10^{-4}$ Pa at 21.3° C. In addition, HCl gas becomes $NH_4Cl$ gas by reacting with $NH_3$ gas, and $NH_4Cl$ also has a low vapor pressure.

As described above, the unreactive residual gas mainly reacts with $NH_3$ gas to thereby be converted into a low vapor pressure compound and HCl as the reaction by-product reacts with $NH_3$ gas to thereby be converted into a low vapor pressure compound, so that they are relatively easily trapped in the trap apparatus 8. The gaseous impurities including the complex, $NH_4Cl$ and the like are introduced into the impurity collecting vessel 50 through the gas inlet 52 of the trap apparatus 8, by being contained in the exhaust gas.

Here, $N_2$ gas as an operation fluid, which is in the supersonic state by the adiabatic expansion, is injected into the impurity collecting vessel 50 through the nozzle unit 64 provided at the ceiling portion thereof. Such $N_2$ gas is mixed with the exhaust gas while the temperature thereof is lowered by itself by the adiabatic expansion (referred to as a self-cooling). In this way, the exhaust gas is cooled, so that the gaseous impurities are cooled below the critical temperatures to thereby be condensed and/or coagulated, and deposited. The impurities M are attached and deposited on the impurity adhesion plate 60 provided on the bottom portion of the impurity collecting vessel 50 to thereby be trapped thereon. The exhaust gas from which the gaseous impurities have been removed as described above is discharged through the gas outlet 54 and flows towards the vacuum pump 36 of the downstream side.

As mentioned above, there is utilized a nozzle, e.g., a Laval nozzle, capable of realizing a supersonic state by converting the pressure difference into a kinetic energy of $N_2$ gas, which is an operation fluid; and thus the gaseous impurities are cooled to be condensed and/or coagulated by a self-cooling when the $N_2$ gas is adiabatically expanded to be a supersonic state. Therefore, the gaseous impurities can be efficiently removed from the exhaust gas.

Further, since the cooling fins and the like, which are used in the conventional trap apparatus, are not employed, cooling efficiency can be kept high all the time. Still further, even though the captured impurities are increased, it does not adversely affect exhaust conductance. Still further, since the cooling fins and the like are not used, as mentioned above, the entire configuration of the trap apparatus 8 can be simplified. At this time, the flow rate of the operation fluid is configured not to adversely affect the pressure control inside the processing vessel 10 of the upstream side.

Still further, in the $N_2$ gas of the operation fluid, there is contained a vapor introduced from the nuclei introduction unit 72. The vapor is cooled in the impurity collecting vessel 50 to become fine ice particles serving as nuclei so that the gaseous impurities are condensed and/or coagulated by using the ice particles as nuclei without being supercooled. As a result, collection efficiency of the impurities can be further increased. Moreover, the nuclei introduction unit 72 may be provided in the impurity collecting vessel 50 to directly introduce the vapor into the impurity collecting vessel 50. This is the same as in other embodiments that will be discussed later.

Still further, the maintenance and repair of the trap apparatus 8 is performed such that the opening/closing door 56 is separated to unload the impurity adhesion plate 60 configured to be attached and detached from the impurity collecting vessel 50, and the impurities M adhered on the impurity adhesion plate 60 are cleaned and removed. Thus, maintenance workability can be considerably enhanced.

For easy understanding of the present invention, in the first embodiment, an example of employing one nozzle unit 64 has been described. However, multiple nozzle units 64 may be provided in parallel with each other to inject into the impurity collecting vessel 50 the operation fluid in which the vapor is contained.

Second Embodiment

Figure 3:
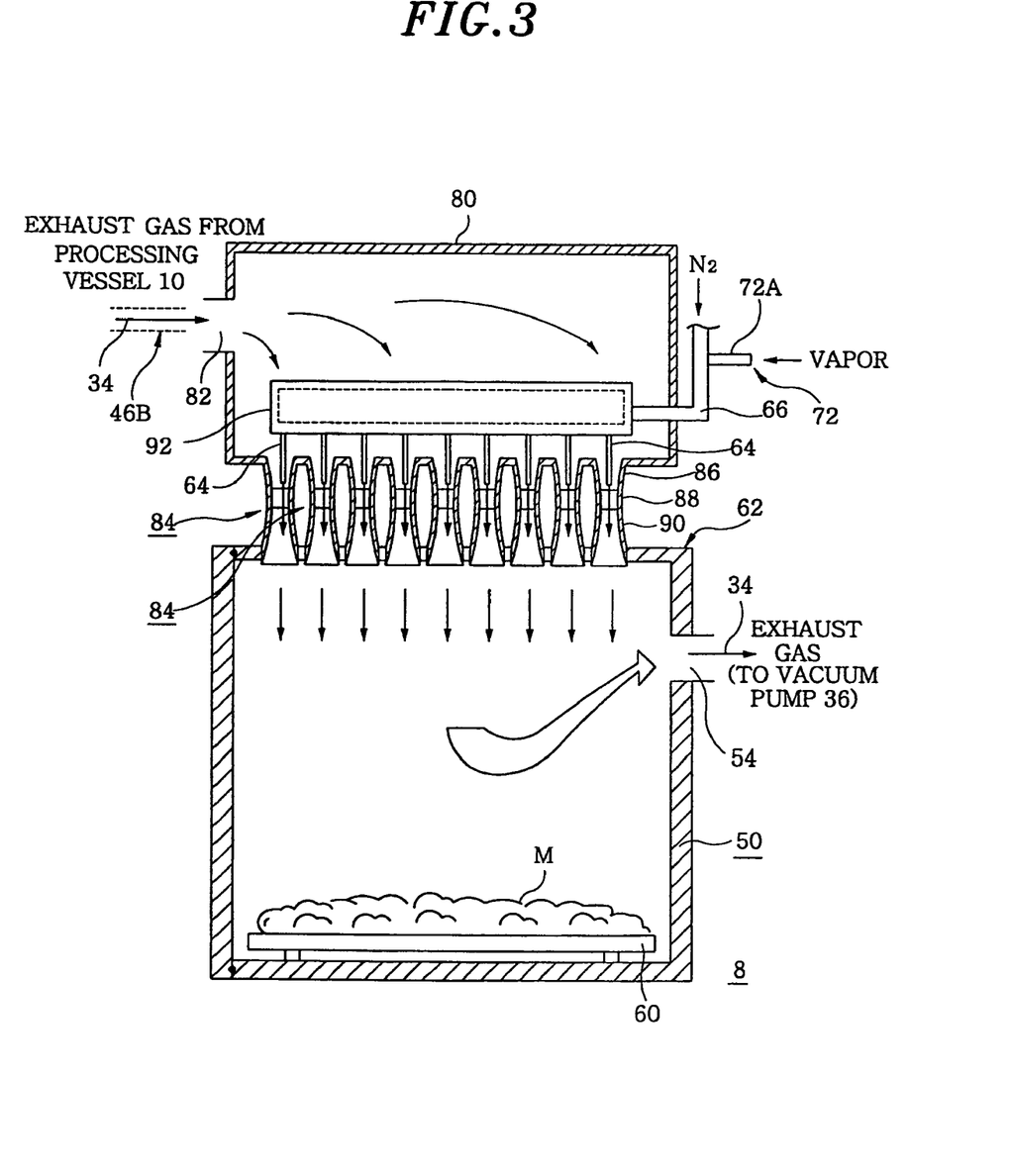
FIG. 3 provides a cross sectional view showing a second embodiment of a trap apparatus in accordance with the present invention.

Next, a second embodiment of the present invention will be discussed. In the second embodiment, the configuration of the nozzle unit 64 in the previously described first embodiment is slightly modified, and a plurality of nozzle units is provided in parallel with each other.

Figure 4:
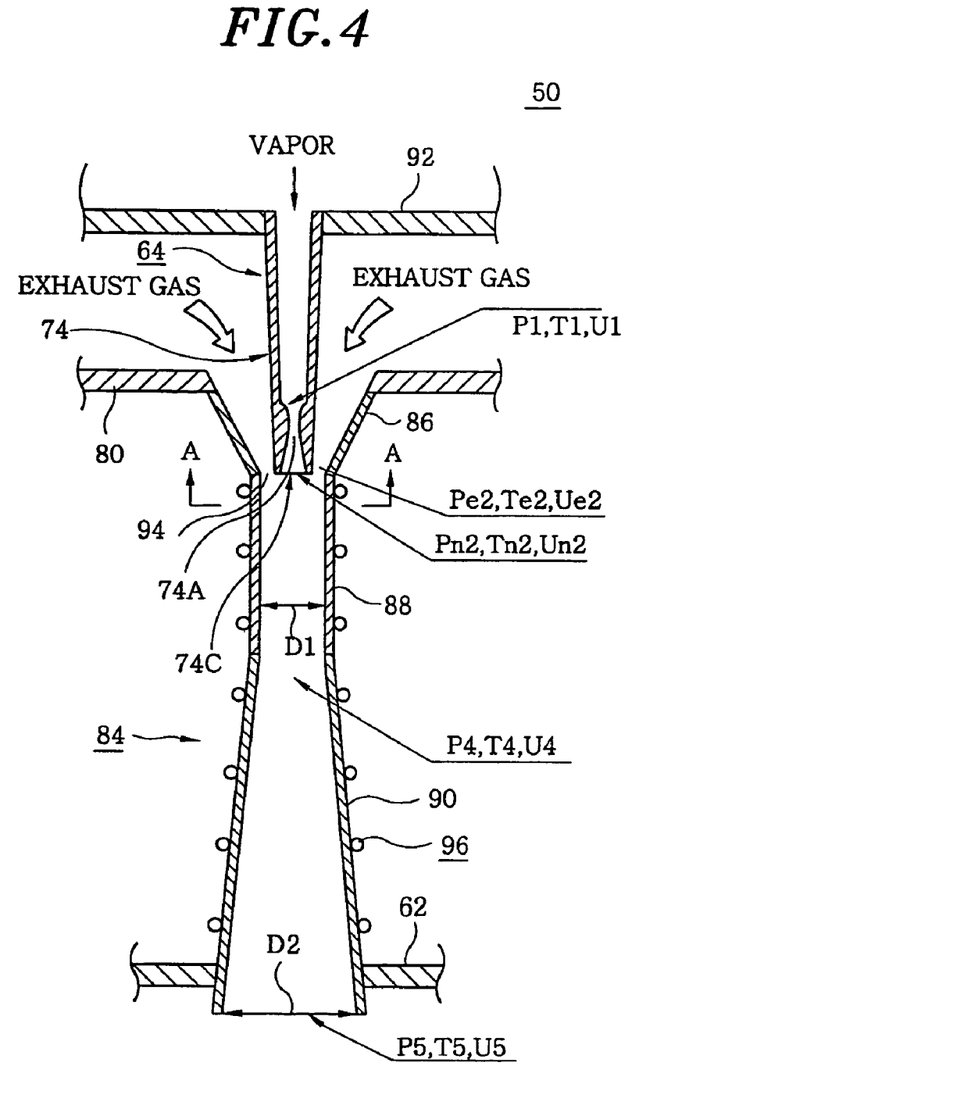
FIG. 4 sets forth to a magnified cross sectional view of a nozzle unit in FIG. 3.
Figure 5:
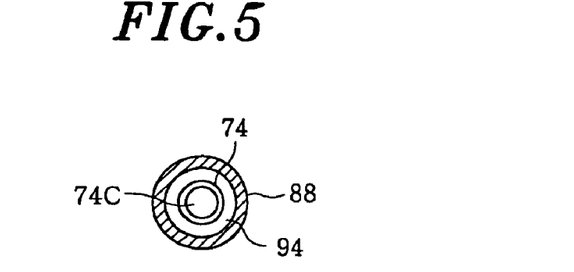
FIG. 5 presents a cross sectional view of a portion taken along A-A' line in FIG. 4.

FIG. 3 is a cross sectional view showing the second embodiment of a trap apparatus in accordance with the present invention; FIG. 4 is a magnified cross sectional view of one nozzle unit in FIG. 3; and FIG. 5 is a cross sectional view of a portion taken along A-A' line in FIG. 4. Further, parts having substantially the same configurations as those described in FIGS. 1 and 2 are designated by the same reference numerals, and their redundant explanations will be omitted unless necessary.

As shown in the drawings, at a front end side of the impurity collecting vessel 50, there is provided, e.g., a stainless steel front end reservoir chamber 80 for temporarily storing or reserving the exhaust gas flowing from the processing vessel 10 side. A gas inlet 82 is provided at one sidewall portion of the front end reservoir chamber 80; and the exhaust gas flows thereinto through the gas inlet 82 connected to the upstream side of exhaust passageway 34.

Further, between a sidewall in the longitudinal direction of the front end reservoir chamber 80 and the ceiling portion 62 of the impurity collecting vessel 50, there are provided multiple, e.g., nine in the drawing, communication passageways 84 in parallel with each other for allowing for the front end reservoir chamber 80 to communicate with the impurity collecting vessel 50. Through the communication passageways 84, the exhaust gas in the front end reservoir chamber 80 flows into the impurity collecting vessel 50. As shown in FIG. 4, each of the communication passageways 84 is formed of a cone shaped introduction tube 86 whose inner diameter becomes gradually smaller along the flow direction of the exhaust gas; a cylindrical shape mixing tube 88 connected to the introduction tube 86; and a diffusion tube 90, connected to the mixing tube 88, whose inner diameter becomes gradually larger along the flow direction of the exhaust gas.

Meanwhile, in the front end reservoir chamber 80, there is provided operation gas header 92 of a specified size, connected to the operation gas line 66, into which the operation gas containing a vapor which becomes an origin of transition to the condensation and/or coagulation is introduced. Further, the respective nozzle units 64 having the same configuration as in FIG. 2 are installed extending from the operation gas header 92 towards the respective communication passageways 84. As shown in FIG. 4, a tip end portion of the nozzle main body 74 in each nozzle unit 64 is placed around joint portion between the introduction tube 86 and the mixing tube 88 without making any contact with them.

Accordingly, as shown in FIG. 5, in this part, an operation fluid injection opening 74C having a substantially circular cross section is formed in the central portion; and an exhaust gas inlet opening 94 having a substantially ring shaped cross section is formed to surround the periphery of the operation fluid injection opening 74C. Thus, the exhaust gas is introduced towards the impurity collecting vessel 50 through the exhaust gas inlet opening 94. Here, as mentioned above, the nozzle main body 74 is configured such that the flow path cross area becomes gradually narrower along the flow direction of the operation fluid in the center side thereof and becomes gradually broader after passing the larynx portion 74A wherein the flow path cross section is the narrowest. Thus, the lowest end portion thereof serves as the operation fluid injection opening 74C having a substantially circular cross section. As for the nozzle unit 64, the above-described Laval nozzle may be used, for example.

As described above, if the operation fluid of the supersonic state is injected from the nozzle units 64, the nozzle units 64 have pumping functions such as an ejector pump and the exhaust gas from the exhaust gas inlet opening 94 is washed away by an ejection stream of the operation fluid to thereby run towards exhaust side.

Further, on outer peripheral walls of the mixing tube 88 and the diffusion tube 90, there are provided adhesion prevention heater units 96, e.g., tape heater. By heating the adhesion prevention heater units 96 to temperatures higher than the critical temperatures of the gaseous impurities, the impurities are prevented from being condensed and/or coagulated in the inner wall surfaces thereof, and thus being attached thereto.

In case of the second embodiment, basically the same operation and effect as in the aforementioned first embodiment could be obtained. For example, the exhaust gas flowing from the processing vessel 10 side is diffused entirely in the front end reservoir chamber 80, and is introduced into the impurity collecting vessel 50 in parallel through the respective communication passageways 84. At the same time, the operation fluid, e.g., $N_2$ gas, is injected in the supersonic state by the adiabatic expansion, through the operation fluid injection opening 74C of each nozzle unit 64 via the operation gas header 92. The supersonic state of $N_2$ gas is diffused in the diffusion tube 90 while being mixed in the mixing tube 88 with the exhaust gas introduced from the ring shaped exhaust gas inlet opening 94, and reaches the impurity collecting vessel 50, wherein the gaseous impurities are cooled to be condensed and/or coagulated, so that the impurities M are adhered on the impurity adhesion plate 60. Accordingly, same as in the first embodiment, the impurities can be efficiently removed from the exhaust gas. Specifically, since the multiple nozzle units 64 are provided in parallel with each other, removal efficiency of the impurities can be increased.

Further, by introducing the nuclei, e.g., vapor, into the operation fluid, the gaseous impurities are not supercooled like in the first embodiment, so that removal efficiency of the impurities can be further increased. While the conventional trap apparatus lowers exhaust conductance, the nozzle units 64 of the second embodiment exhibit pumping functions such that the exhaust gas from the ring shaped exhaust gas inlet port 94 provided around the operation fluid injection opening 74C is sucked to thereby be washed away towards exhaust side. Therefore, exhaust conductance can be increased, and the exhaust system is not adversely affected. Moreover, the adhesion prevention heater units 96 are provided at the mixing tube 88 and the diffusion tube 90, so that the impurities can be prevented from being attached to the inner wall surface sides.

As a result of a study for parameters such as temperature, pressure, gas velocity and the like, in each part of the configuration shown in FIG. 4, the following results could be obtained.

Operation fluid pressure at nozzle inlet P1: $1.33 \times 10^4$ Pa ($\approx 0.1$ atm)

Gas temperature T1 of operation fluid inside the operation gas source 68: 293 K (20° C.)

Gas velocity U1 of operation fluid at nozzle inlet: 0.0 m/s (it can be treated as zero compared with the supersonic speed)

Specific heat ratio k of gas: 1.4

Exhaust gas pressure Pe2 at the exhaust gas inlet opening 94: 133 Pa

Exhaust gas temperature Te2 at the exhaust gas inlet opening 94: 423 K (150° C.)

Exhaust gas velocity Ue2 at the exhaust gas inlet opening 94: 328.2 m/s

Area Se of the exhaust gas inlet opening 94: 808.5 mm$^2$

Area Sn of the operation fluid injection opening 74C: 1155.0 mm$^2$

Diameter D1 of the mixing tube 88: 50.0 mm

Outlet diameter D2 of the diffusion tube 90: 53.9 mm

When setting the parameters as described above, the following results were obtained.

Pressure Pn2 at nozzle outlet: 133 Pa ($\approx 0.001$ atm)

Operation fluid temperature Tn2 at nozzle outlet: 78.6 K (−194.4° C.)

Operation fluid velocity Un2 at nozzle outlet: 656.4 m/s (supersonic state)

Pressure P4 at outlet of the mixing tube 88: 133 Pa

Temperature T4 of gaseous mixture at outlet of the mixing tube 88: 150.8 K (−122.2° C.)

Velocity U4 of gaseous mixture at outlet of the mixing tube 88: 413.3 m/s

Pressure P5 at outlet of the diffusion tube 90: 189.9 Pa

Temperature T5 of gaseous mixture at outlet of the diffusion tube 90: 167.0 K (−106.0° C.)

Velocity U5 of gaseous mixture at outlet of the diffusion tube 90: 372 m/s

As described above, it could be secured that the temperature of the gaseous mixture is kept very low until the operation fluid reaches the impurity collection vessel 50 via the mixing tube 88 and the diffusion tube 90 after being injected from the outlet of the nozzle in the supersonic state.

Third Embodiment

Figure 6:
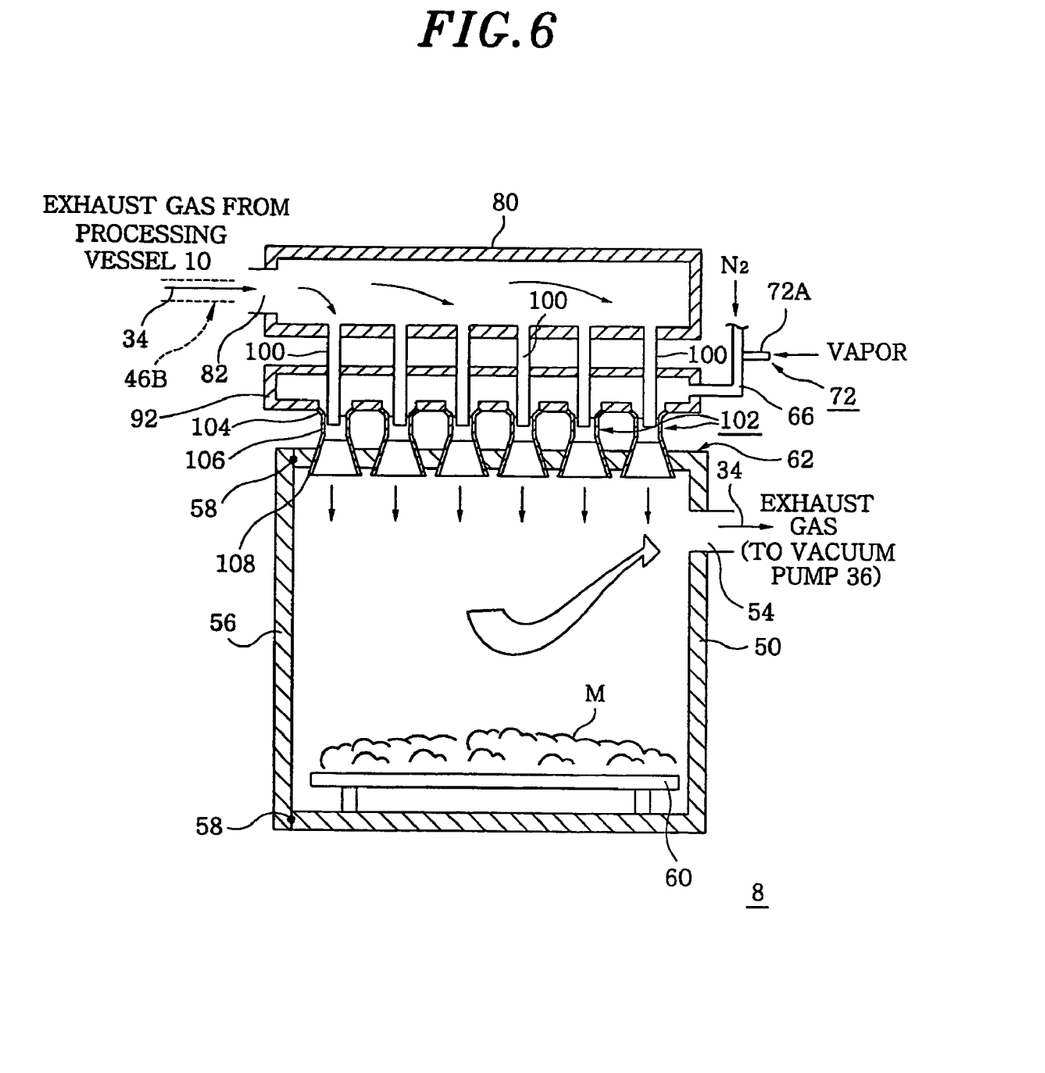
FIG. 6 depicts a cross sectional view showing a third embodiment of a trap apparatus in accordance with the present invention.

Next, a third embodiment of the present invention will be discussed. The third embodiment is configured such that central sides and outer periphery sides of the nozzle units 64 of the previously described second embodiment are reversed. In such a configuration, the operation fluid is injected through the outer periphery sides and the exhaust gas flows through the central sides.

Figure 7:
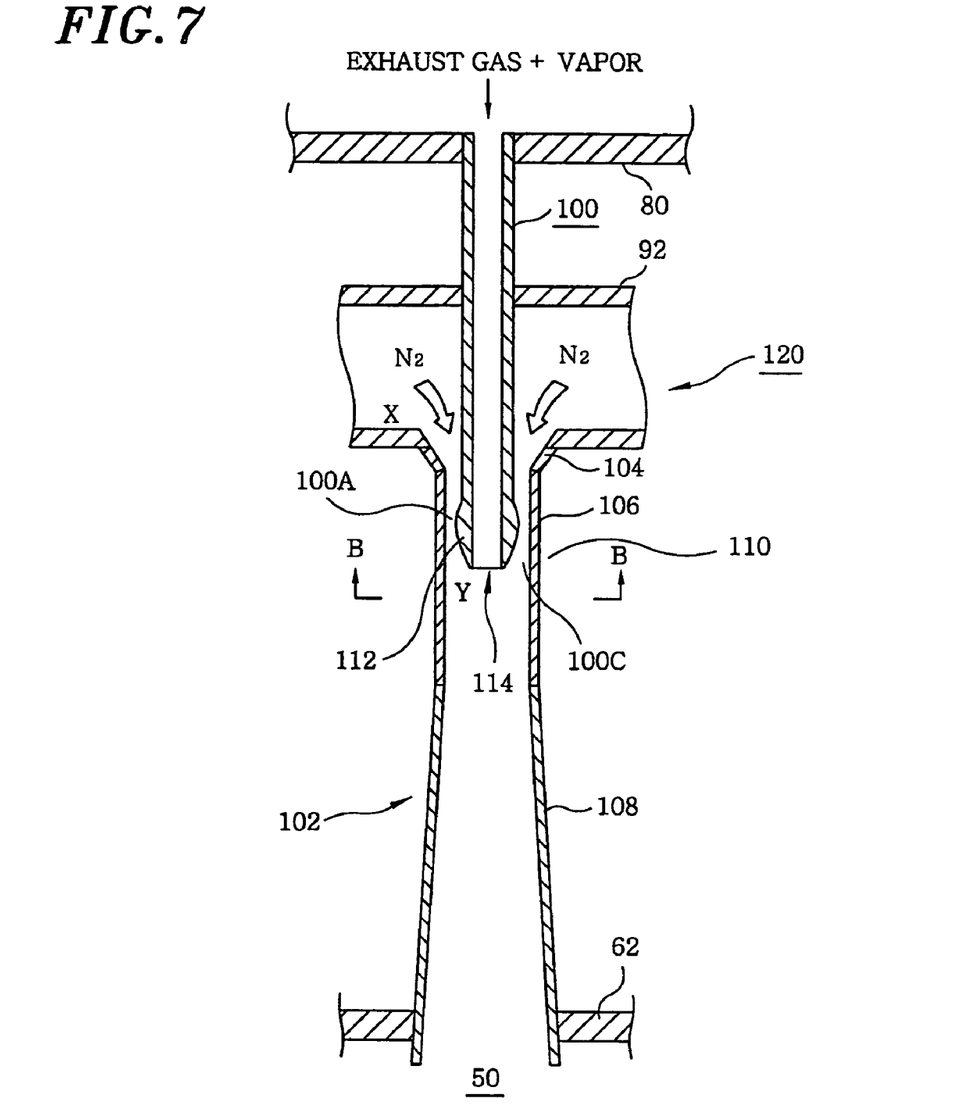
FIG. 7 describes a magnified cross sectional view of a nozzle unit in FIG. 6.
Figure 8:
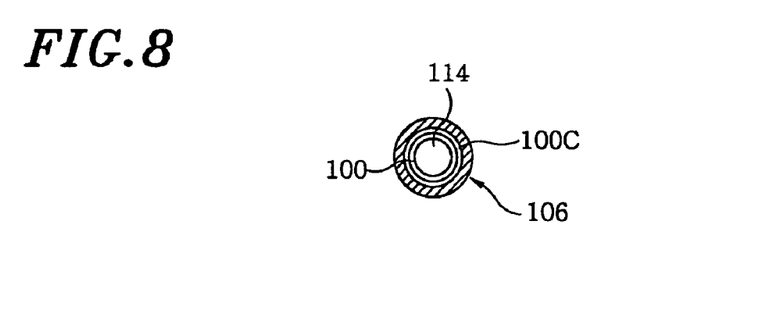
FIG. 8 is a cross sectional view of a portion taken along B-B' line in FIG. 7.

FIG. 6 is a cross sectional view showing the third embodiment of a trap apparatus in accordance with the present invention; FIG. 7 is a magnified cross sectional view of one nozzle unit in FIG. 6; and FIG. 8 is a cross sectional view of a portion taken along B-B' line in FIG. 7. Further, parts having substantially the same configurations as those described in FIGS. 3 to 5 are designated by the same reference numerals, and their redundant explanations will be omitted unless necessary.

As shown in the drawings, same as in the second embodiment, at a front end side of the impurity collecting vessel 50, there is provided a stainless steel front end reservoir chamber 80 for temporarily storing or reserving the exhaust gas flowing from the processing vessel 10 side. A gas inlet 82 is provided at one sidewall portion of the front end reservoir chamber 80; and the exhaust gas flows thereinto through the gas inlet 82 connected to the upstream side of exhaust passageway 34.

Further, there are installed multiple, e.g., six in the drawing, nozzle main bodies 100 extending from the sidewall in the longitudinal direction of the front end reservoir chamber 80 towards the impurity collecting vessel 50. Moreover, between the front end reservoir chamber 80 and the impurity collecting vessel 50, there is installed an operation gas header 92 of a specified size connected to the operation gas line 66.

Still further, between the sidewall in the longitudinal direction of the operation gas header 92 and the ceiling portion 62 of the impurity collecting vessel 50, there are provided multiple, e.g., six in the drawing, communication passageways 102 to allow for the operation gas header 92 to communicate with the impurity collecting vessel 50. Through the communication passageways 102, the operation fluid in the operation gas header 92 flows into the impurity collecting vessel 50. As shown in FIG. 7, each of the communication passageways 102 is formed of a cone shaped introduction tube 104 whose inner diameter becomes gradually smaller along the flow direction of the operation fluid; a cylindrical shape mixing tube 106 connected to the introduction tube 104; and a diffusion tube 108, connected to the mixing tube 88, whose inner diameter becomes gradually larger along the flow direction of the exhaust gas (operation fluid).

Here, a nozzle outer container 110 is formed of the introduction tube 104 and the mixing tube 106; and a nozzle unit 120 is formed of the nozzle outer container 110 and the nozzle main body 100. Specifically, the nozzle main body 100 air-tightly penetrates one sidewall of the operation gas header 92 to be inserted in the header; and a tip end portion of the nozzle main body 100 reaches into the mixing tube 106 without making any contact therebetween. Further, at an outer periphery of the tip end portion of the nozzle main body 100, there is formed a ring shaped passage narrowing portion 112 having a protruded shape of cross section where a flow path cross area becomes gradually narrower along the flow direction of the operation fluid and becomes gradually broader after passing a larynx portion 100A wherein the flow path cross section is the narrowest. Thus, the pressure difference between X portion and Y portion (see FIG. 7), when the operation fluid passes the larynx portion 100A and the narrowing portion 112, is efficiently converted into a velocity, so that the supersonic state can be realized at a lower temperature.

Accordingly, as shown in FIG. 8, an exhaust gas inlet opening 114 having a substantially circular cross section is formed in the central portion; and an operation fluid injection opening 100C having a substantially ring shaped cross section is formed to surround the periphery of the exhaust gas inlet opening 114. Thus, the exhaust gas is introduced towards the impurity collecting vessel 50 through the exhaust gas inlet opening 114. Further, the operation fluid is injected from the operation fluid injection opening 100C. Still further, the passage narrowing portion 112 having a protruded shape of cross section may be provided in an inner side of the mixing tube 106 instead of being provided in the nozzle main body 100 side, or it may be provided in both sides. In addition, it may adopt various shapes, as long as so-called Laval nozzle capable of injecting the operation fluid in the supersonic state can be formed.

The third embodiment can exhibit the same operation and effect as in the previous first and second embodiments. Namely, the exhaust gas is discharged through the exhaust gas inlet opening 114 via the center of the nozzle main body 100; and the $N_2$ gas of the operation fluid is injected from the ring shaped operation fluid injection opening 100C through the introduction tube 104 and the larynx portion 100A from the operation gas header 92. At this time, the $N_2$ gas is adiabatically expanded to thereby be cooled by the self-cooling, so that it is injected at a lower temperature in the supersonic state. Thus, as mentioned above, the gaseous impurities are made to be condensed and/or coagulated by sucking the exhaust gas. In this case, like in the second embodiment, the nozzle unit 120 exhibits pumping function to thereby prevent exhaust conductance from being adversely affected.

Further, in the third embodiment, it is possible to prevent the exhaust gas from being directly contacted with the inner wall surface of the mixing tube 106 and the diffusion tube 108, since the $N_2$ gas of the operation fluid flows to surround the periphery of the exhaust gas. Therefore, it is possible to prevent the condensed and/or coagulated impurities from being attached to the inner wall surface of the mixing tube 106 and the diffusion tube 108. Moreover, in the third embodiment, like in the second embodiment, there may be provided the adhesion prevention heater units 96 for completely preventing the impurities from being attached thereto.

Still further, in the respective embodiments, the vapor has been introduced and frozen to form nuclei, which become origins of transition to the condensation and/or coagulation, but it is not limited thereto. A powder such as ceramic, quartz or the like may be employed. In addition, the operation fluid is not limited to the $N_2$ gas, and an inactive gas such as Ar gas, He gas or the like, $H_2$ gas and the like, may be used.

Still further, a film species to be formed is not limited to the Ti film; and the present invention may be adopted to all film forming apparatus or processing apparatus wherein reaction by-products or unreacted materials need to be removed from the exhaust gas.

Still further, in the respective embodiments, examples of using the semiconductor wafer as the substrate to be processed have been described, but it is not limited thereto. A glass substrate, an LCD substrate or the like may be used.

As mentioned above, in accordance with a trap apparatus, a processing system and an impurity removal method of the present invention, the operation fluid adiabatically expanded by the nozzle unit to thereby be in the supersonic state is injected into the exhaust gas, so that the exhaust gas is cooled to condense and/or coagulate the gaseous impurities, to thereby trap them. Therefore, cooling efficiency can be kept high all the time, and thus collection efficiency can be kept high all the time. Further, when performing a maintenance and repair operation for removing, e.g., viscous captured materials, which have been condensed and/or coagulated to thereby be attached to impurity collecting vessel, the maintenance and repair operation can be carried out rapidly and easily since complicated structures such as the cooling fins and the like used for the conventional trap apparatus are not necessary. Still further, since the mixing tube and the diffusion tube are heated by the adhesion prevention heater unit, it is possible to prevent the impurities as, e.g., viscous semisolid materials, from being attached to the inner wall surfaces. Still further, the gaseous impurities are prevented from being in the supercooled state to thereby facilitate the condensation and/or coagulation by introducing nuclei into the exhaust gas, so that collection efficiency of the impurities can be further improved.

What is claimed is:

1. A trap apparatus, installed in a vacuum exhaust system having a vacuum pump for vacuum exhausting a processing apparatus for performing a process on an object, for removing a gaseous impurity contained in an exhaust gas flowing through the vacuum exhaust system, the trap apparatus comprising:
   an impurity collecting vessel installed in an exhaust passageway of the vacuum exhaust system; and
   a nozzle unit for injecting an operation fluid to mix therewith the exhaust gas, and lowering an exhaust gas temperature down to or below a critical temperature of the impurity in the impurity collecting vessel, wherein the operation fluid is in a supersonic state by adiabatic expansion.

2. The trap apparatus of claim 1, further comprising one or more nozzle units provided in parallel with each other with respect to the impurity collecting vessel.

3. The trap apparatus of claim 1, wherein the nozzle unit includes a nozzle main body configured to have a flow path whose cross section becomes narrower along a flow direction of the operation fluid, and then, becomes wider after passing a larynx portion.

4. The trap apparatus of claim 3, wherein the nozzle main body has an operation fluid injection opening having a substantially circular cross section; and a ring shaped exhaust gas inlet opening is formed to surround a periphery of the operation fluid injection opening to thereby introduce the exhaust gas towards the impurity collecting vessel.

5. The trap apparatus of claim 3, wherein the nozzle main body has an operation fluid injection opening having a substantially ring shaped cross section; and, in a central portion thereof, there is formed a substantially circular exhaust gas inlet opening for introducing the exhaust gas towards the impurity collecting vessel.

6. The trap apparatus of claim 4, wherein there is provided a front end reservoir chamber for temporarily reserving the exhaust gas flowing towards the exhaust gas inlet opening.

7. The trap apparatus of claim 4, wherein, at a tip end side of the nozzle unit, there are provided a mixing tube for mixing the operation fluid in the supersonic state injected from the operation fluid injection opening and the exhaust gas introduced from the exhaust gas inlet opening; and a diffusion tube whose flow path cross section becomes gradually broader to have a pumping function, wherein the mixing tube and the diffusion tube are connected in sequence.

8. The trap apparatus of claim 7, wherein the mixing tube and the diffusion tube are provided with an adhesion prevention heater unit for preventing the impurity from being attached thereto by being condensed and/or coagulated.

9. The trap apparatus of claim 1, wherein there is installed a nuclei introduction unit for introducing a substance to be used as nuclei when the gaseous impurity is condensed and/or coagulated.

10. The trap apparatus of claim 1, wherein, in the impurity collecting vessel, there is attachably and detachably installed an impurity adhesion plate for adhering thereon a condensed and/or coagulated impurities.

11. The trap apparatus of claim 1, wherein the nozzle unit is a Laval nozzle.

12. The trap apparatus of claim 1, wherein the operation fluid is formed of $N_2$, $H_2$, Ar or He gas.

13. The trap apparatus of claim 1, wherein the processing apparatus is a film forming apparatus for performing a film formation on the object.

14. A processing system, comprising:
- a processing apparatus for performing a process on an object;
- a vacuum exhaust system having a vacuum pump for vacuum exhausting the processing apparatus; and
- the trap apparatus of claim 1 installed in the vacuum exhaust system.

15. An impurity removal method for removing a gaseous impurity from an exhaust gas discharged from a processing apparatus which performs a process on an object, the method comprising the step of:

condensing and/or coagulating the impurity by mixing an operation fluid and the exhaust gas injecting the operation fluid into the exhaust gas, the operation fluid being in a supersonic state by adiabatic expansion; and lowering an exhaust gas temperature down to or below a critical point of the impurity.

16. The impurity removal method of claim 15, wherein the exhaust gas is injected to surround a periphery of the operation fluid when the exhaust gas and the operation fluid are mixed.

17. The impurity removal method of claim 15, wherein the operation fluid is injected to surround a periphery of the exhaust gas when the exhaust gas and the operation fluid are mixed.

* * * * *